United States Patent
Choi

(10) Patent No.: US 7,827,520 B2
(45) Date of Patent: Nov. 2, 2010

(54) METHOD FOR CORRECTING OPTICAL PROXIMITY EFFECT

(75) Inventor: Jae Seung Choi, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 434 days.

(21) Appl. No.: 11/959,075

(22) Filed: Dec. 18, 2007

(65) Prior Publication Data

US 2008/0295059 A1    Nov. 27, 2008

(30) Foreign Application Priority Data

May 21, 2007    (KR) .................. 10-2007-0049346

(51) Int. Cl.
    *G06F 17/50* (2006.01)
(52) U.S. Cl. .............. 716/19; 716/4; 716/5; 716/8; 716/9; 716/10; 716/20; 716/21; 430/5; 430/30
(58) Field of Classification Search ............ 716/4–5, 716/8–10, 19–21; 430/5, 30
    See application file for complete search history.

(56) References Cited

U.S. PATENT DOCUMENTS

| 6,928,636 | B2 * | 8/2005 | Ohnuma ................ 716/21 |
| 6,996,797 | B1 | 2/2006 | Liebmann et al. |
| 7,010,775 | B2 * | 3/2006 | Ohmori ................. 716/19 |
| 7,213,226 | B2 | 5/2007 | Kotani et al. |
| 7,438,996 | B2 * | 10/2008 | Ozawa ................... 430/5 |
| 2003/0192015 | A1 * | 10/2003 | Liu ....................... 716/4 |

FOREIGN PATENT DOCUMENTS

| KR | 10-2003-0007951 | 1/2003 |
| KR | 10-2003-0060747 | 7/2003 |
| KR | 10-2005-0078225 | 8/2005 |
| KR | 10-2005-0099457 | 10/2005 |

* cited by examiner

*Primary Examiner*—Nghia M Doan

(57) ABSTRACT

A method of correcting an optical proximity effect may include the steps of: fabricating a test mask having test patterns; projecting patterns on a wafer using the test mask; measuring line widths of the patterns formed on the wafer; and executing a model calibration using the measured line widths and writing a correction recipe. The entire area of the wafer chip may be divided into a plurality of templates. An optical proximity correction may be executed on one of the templates and it may be verified that the optical proximity correction was executed properly on another template. The data for the templates that pass a verification may be merged and final data may be written using the merged data. A photomask may be fabricated using the final data.

10 Claims, 2 Drawing Sheets

METHOD FOR CORRECTING OPTICAL PROXIMITY EFFECT

CROSS-REFERENCES TO RELATED APPLICATION

Priority to Korean patent application number 10-2007-0049346, filed on May 21, 2007, the disclosure of which is incorporated by reference in its entirety, is claimed.

FIELD OF INVENTION

The present invention relates to a method of fabricating a photomask and, more particularly, to a method of correcting an optical proximity effect at the time of fabricating a photomask.

BACKGROUND OF THE INVENTION

As semiconductor devices are developed with high integration, the size of patterns required for a semiconductor device is getting smaller. As the size of patterns is getting smaller, influence between adjacent patterns during the photolithography process causes an optical proximity effect. Accordingly, an optical proximity correction (OPC) is executed to correct a layout designed by a designer and to suppress pattern distortion caused by the optical proximity effect.

A process of optical proximity correction starts with designing a layout of target patterns to be projected on a wafer and fabricating a test mask having test patterns. Patterns are formed on the wafer by performing a wafer process using the test mask and the line widths of the patterns formed on the wafer are measured. A model calibration for the optical proximity correction is executed using the data on the measured line widths. An optimal recipe necessary for the optical proximity correction is written using the calibrated model. The optical proximity correction is executed using the calibrated model and the recipe, and it is verified whether the optical proximity correction was properly executed. It is, then, decided whether an error detected during the verification process is within a range of an error tolerance.

If the error detected during the verification process is outside the range of the error tolerance, the optical proximity correction is re-executed in all areas of the mask by re-executing the model calibration and correcting the recipe. At this time, after the optical proximity correction is completed, the error may be outside the range of the error tolerance, in only a specific pattern or area. Nevertheless, according to the conventional optical proximity correction process, the optical proximity correction is re-executed again for the entire wafer chip using a new model or a new recipe in order to correct a specific pattern or area. As patterns become finer and more complex, executing the optical proximity correction becomes increasingly time consuming. Accordingly, an improved optical proximity correction is required to reduce the time for fabricating a mask.

SUMMARY OF THE INVENTION

In one embodiment of the present invention, a method of correcting an optical proximity effect may include: fabricating a test mask having test patterns; forming wafer patterns on a wafer using the test mask; measuring line widths of the wafer patterns formed on the wafer; executing a model calibration using the measured line widths and writing a correction recipe using the model calibration; dividing the entire area of the wafer into a plurality of templates; executing an optical proximity correction on one of the templates and verifying whether the optical proximity correction completed on a different template was properly executed during executing an optical proximity correction; merging data on the templates that pass the verification and writing final data; and fabricating a photomask using the final data. The entire area of the wafer may be divided into a plurality of templates having a substantially constant size; may be designated each of the templates for execution of the optical proximity correction. The individual templates may, also, be divided into a plurality of polygons The execution and verification of the optical proximity correction may be repeated until an error value generated by the verification is within a range of an error tolerance.

In another embodiment of the present invention, a method of correcting an optical proximity effect may include: fabricating a test mask having test patterns; forming wafer patterns on a wafer using the test mask; measuring line widths of the wafer patterns formed on the wafer; executing a model calibration using the measured line widths and writing a correction recipe using the model calibration; dividing the entire area of the wafer chip into a plurality of templates; executing a optical proximity correction on one of the templates and verifying to determine whether the optical proximity correction was properly executed during executing an optical proximity correction; re-executing the optical proximity correction on a template in which an error was generated as a result of the verification and re-verifying to determine whether the optical proximity correction was properly executed; merging data on the templates that pass the verifications and re-verifications; writing final data using the merged data; and fabricating a photomask using the final data. The re-execution of optical proximity correction and the re-verification may include generating an error marker to select the templates in which the error was generated as a result of the verification and re-executing the optical proximity correction and the re-verifying on the template selected by the error marker. The method may further include: designating an arbitrary layer number to select the templates in which the error is generated as a result of the re-verification; blocking the templates, on which re-execution of the optical proximity correction was properly completed; and performing re-execution of the optical proximity correction and re-verification on the templates selected by the designated layer number. The re-execution of the optical proximity correction and the re-verification may be repeated until a verification result for the templates is within the range of an error tolerance. The first optical proximity correction may be executed, for example, through a polygon-based approach. The second optical proximity correction may be re-executed, for example, through a grid-based or multiple dissection approach.

DESCRIPTION OF SPECIFIC EMBODIMENTS

Hereinafter, the present invention will be described in detail through embodiments. The embodiments are just for exemplifying the present invention, and the scope of right to be protected of the present invention is not limited by them.

Figure 1:
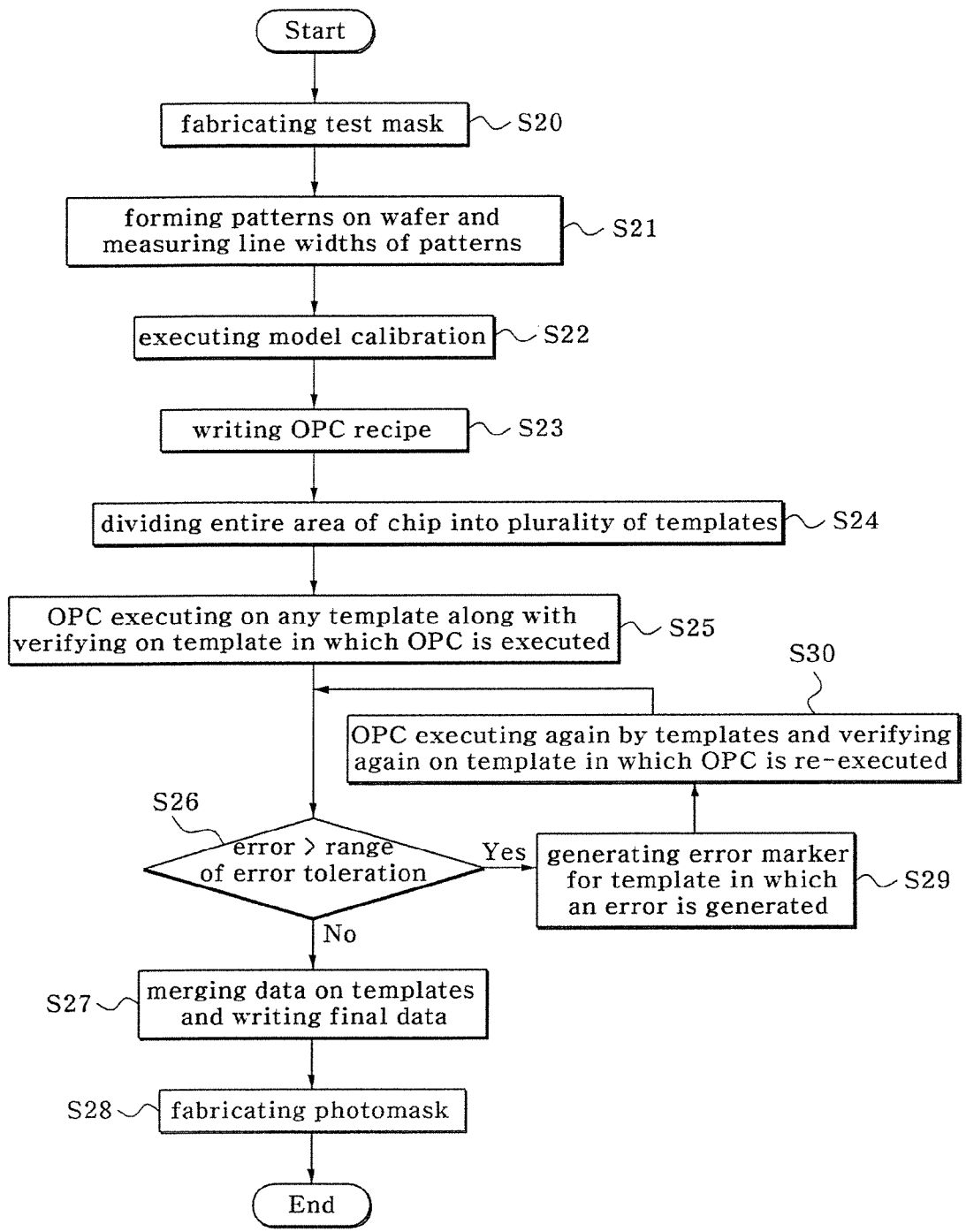
FIG. 1 is a flow chart for schematically illustrating a method of correcting an optical proximity effect according to the present invention.

Referring to FIG. 1, a layout of target patterns to be projected on a wafer is designed and a test mask having test patterns is fabricated using the designed layout S20. The test patterns can be formed by performing a pattern projection process implemented on an actual photomask, or a corresponding process.

A wafer process that includes a photolithography process and an etching process may be performed using the test mask so that wafer patterns are formed on the actual wafer. Line widths of the wafer patterns formed on the actual wafer are measured and the critical dimension (CD) data are derived from the measurement S21 (FIG. 1).

A model calibration for an optical proximity correction may be executed using the measured line widths S22 (FIG. 1). For example, a model, which can properly represent a pattern projection process using the data on the line widths of the wafer patterns implemented on the wafer, is obtained, and a simulation is performed on the obtained model to obtain a simulated contour.

An optical proximity correction (OPC) recipe may be written using the calibration model S23 (FIG. 1). The optimization of a correction recipe may be carried out by comparing the simulated contour with an original layout of the target patterns. By using the optimized correction recipe, the entire area of a wafer full chip may be divided into a plurality of templates S24 (FIG. 1). The division can be done, satisfying whatever condition a designer wants.

Among the plurality of templates, one template may be designated. The optical proximity correction may be executed on a pattern included the designed layout within the designated template and it may be verified whether the optical proximity correction was properly executed on another template S25 (FIG. 1). By way of example, a first template may be designated and the optical proximity correction may be executed for the first template. When the optical proximity correction for the first template is completed, the optical proximity correction for a second template may be executed. While the optical proximity correction for the second template is executed, it may be verified whether the optical proximity correction completed for the first template was properly executed. The execution of the optical proximity correction on one template and verification of the optical proximity correction on another template may be simultaneously performed.

The process of designating any template, executing the optical proximity correction on the designated template, and verifying whether the optical proximity correction was properly executed on another template may be repeated until the optical proximity correction and the verification on the entire area of the wafer full chip are completed.

The optical proximity correction can be executed through a polygon-based approach. That is, data derived from a designated template may be divided into polygons of various sizes and then a simulation for all points which represent the polygons may be performed.

The verification on the optical proximity correction may be done by comparing the original designed layout by the designer with the simulated contour. Simulated contour is decided whether the error is out of a range of an error tolerance S26 (FIG. 1).

At this time, in the case that an error value, obtained at the time of verification, is within the range of the error tolerance, all data for templates in which the error value is within the range of error tolerance may be merged. Final data may be derived from the merged data S27 (FIG. 1). An actual photomask may be fabricated using the derived final data S28 (FIG. 1).

An error marker may be generated to select templates having an error value outside the range of the error tolerance S29 (FIG. 1). The optical proximity correction is re-executed by applying an appropriate model and recipe only for the templates selected by the error marker. Re-verification is only done for the templates on which the optical proximity correction was re-executed. S30 (FIG. 1).

One template may be designated among the templates selected by the error marker. The optical proximity correction may be re-executed on the designated template and it may be re-verified whether the optical proximity correction completed on another template was properly re-executed. These processes may be repeated until the templates selected by the error marker have an error value within the range of the error tolerance.

The optical proximity correction can be re-executed using a grid-based approach. Data derived only from the templates selected by the error marker may be divided into a plurality of grids, each of which has a substantially constant size, and then a simulation for all points which represent the grids is performed. Also, the optical proximity correction can be re-executed using multiple dissection or a multiple evaluation point approach.

The optical proximity correction may be executed on the templates after the templates have been divided into polygons, and re-executed on the templates selected by the error marker after the templates are divided into grids. therefore, This will increase the accuracy of the optical proximity correction.

Meanwhile, in the case that the error value for the templates on which the re-execution and the re-verification were done is outside the range of the error tolerance, the templates in which the error is generated as a result of the re-verification may be designed. The templates for which the optical proximity correction is properly completed may be blocked so that the re-execution and the re-verification can be selectively performing only on the templates selected by the designated layer number.

The re-execution and re-verification of optical proximity correction may be repeated on the templates selected by the error market until the error is within the range of the error tolerance. Consequently, if all templates are within the range of the error tolerance, data obtained from each template may be merged to derive final data. And an actual photomask may be fabricated using the derived data.

Execution of the optical proximity correction on one template and verification that the optical proximity correction was properly executed on another template may be performed at substantially the same time. Further, an error marker may be generated to select templates for which an error outside the range of error tolerance was generated during the verification of the optical proximity correction. Thus, the re-execution and the re-verification may be done only for the sorted templates. Therefore, the time it takes to correct the optical proximity effect can be efficiently reduced. Also, the accuracy of the correction of the optical proximity effect can be improved by executing the optical proximity correction on only the templates that are divided from the wafer full chip area.

Figure 2:
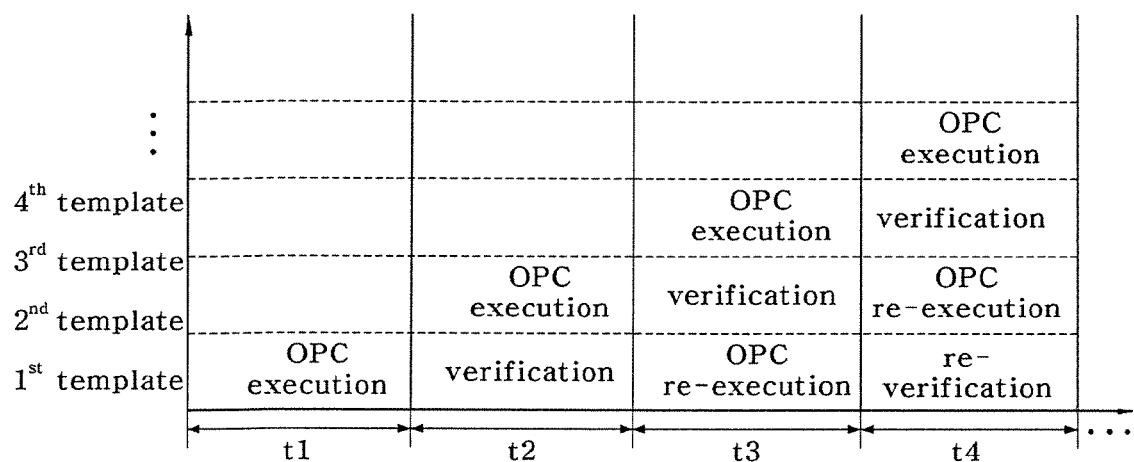
FIG. 2 is a view illustrating one embodiment of a method of correcting an optical proximity effect.

Referring to FIG. 2, by way of example only, after a first template is designated, the optical proximity correction on the first template is executed for a first time, t1. When the optical proximity correction on the first template is completed, the optical proximity correction on any second template is executed for a second time, t2, and it is verified whether the optical proximity correction on the first template was properly executed. An error marker is generated to select templates having an error value outside the range of the error tolerance.

When the optical proximity correction on the second template is completed, the optical proximity correction on a third template is executed for a third time, t3. It is, also, verified whether the optical proximity correction on the second template was properly executed. Also, the optical proximity correction may be re-executed on the first template if it was selected by the error marker. Of course, the re-execution is done only in the case that the error marker selected the first template.

When the optical proximity correction on the third template is completed, the optical proximity correction on a fourth template is executed for a fourth time, t4. It is, also, verified whether the optical proximity correction on the third template was properly executed. Also, the optical proximity correction may be re-executed on the second template if the error marker selected the second template and it may be re-verified whether the re-executed optical proximity correction on the first template was properly executed. At this time, in the case that the error marker did not select the second template, data on templates that were not selected by the error marker, are merged to derive final data.

As described above, the optical proximity correction is executed and verified on a template by template basis and, the error marker selects individual templates. Thus, the re-execution and the re-verification are done only for templates selected by the error marker. Therefore, the time it takes to correct the optical proximity effect can be efficiently reduced.

Although preferred embodiments of the invention have been disclosed for illustrative purposes, those skilled in the art will appreciate that various modifications, additions, and substitutions are possible without departing from the scope and spirit of the invention as defined in the accompanying claims.

What is claimed is:

1. A method of correcting an optical proximity effect, comprising:
   fabricating a test mask having test patterns;
   forming wafer patterns on a wafer using the test mask;
   measuring line widths of the wafer patterns formed on the wafer;
   executing a model calibration using the measured line widths;
   writing a correction recipe using the model calibration;
   dividing an entire area of the wafer into a plurality of templates;
   executing an optical proximity correction using the correction recipe on one of the plurality of templates;
   verifying whether the optical proximity correction completed on a different template was properly executed, wherein the verifying step is executed in parallel with the executing an optical proximity correction step;
   merging data on the corrected templates that pass the verification and writing final data based on merged data; and
   fabricating a photomask using the final data.

2. The method of claim 1, wherein the dividing of the entire area of the wafer comprises:
   dividing the entire area of the wafer into a plurality of templates having a substantially constant size; and
   designating each of the templates for execution of the optical proximity correction.

3. The method of claim 2, wherein the templates are divided into a plurality of polygons.

4. The method of claim 1, wherein the execution of the proximity correction and the verification of the optical proximity correction are repeated until an error value generated by the verification is within a range of an error tolerance.

5. A method of correcting an optical proximity effect, comprising:
   fabricating a test mask having test patterns;
   forming wafer patterns on a wafer using the test mask;
   measuring line widths of the wafer patterns formed on the wafer;
   executing a model calibration using the measured line widths;
   writing a correction recipe using the model calibration;
   dividing an entire area of the wafer into a plurality of templates;
   executing an optical proximity correction using the correction recipe on one of the templates;
   verifying whether the optical proximity correction completed on other template was properly executed, wherein the verifying step is executed in parallel with the executing an optical proximity correction step;
   re-executing the optical proximity correction on a template in which an error was generated as a result of the verification and, re-verifying to determine whether the optical proximity correction was properly re-executed;
   merging data on the corrected templates that pass the verifications and re-verification;
   writing final data using merged data; and
   fabricating a photomask using the final data.

6. The method of claim 5, wherein the re-executing the optical proximity correction and the re-verifying comprise:
   generating an error marker to select the templates in which the error is generated as a result of the verification;
   re-executing the optical proximity correction and the re-verifying on the template selected by the error marker.

7. The method of claim 6, after the step of re-verifying further comprising:
   designating an arbitrary layer number to select the templates in which the error is generated as a result of the re-verification;
   blocking the templates, on which the re-execution of the optical proximity correction was properly completed; and
   performing re-execution of the optical proximity correction and re-verification on the template selected by the designated layer number.

8. The method of claim 5, wherein the re-execution of the optical proximity correction and the re-verification are repeated until the error is within a range of an error tolerance.

9. The method of claim 5, wherein the optical proximity correction is executed using a polygon-based approach.

10. The method of claim 5, wherein the optical proximity correction is re-executed using a grid-based approach or multiple dissection.

* * * * *